United States Patent
Muri et al.

(10) Patent No.: US 11,038,028 B2
(45) Date of Patent: Jun. 15, 2021

(54) SEMICONDUCTOR DEVICE AND MANUFACTURING METHOD

(71) Applicant: Infineon Technologies AG, Neubiberg (DE)

(72) Inventors: Ingo Muri, Villach (AT); Johannes Konrad Baumgartl, Riegersdorf (AT); Oliver Hellmund, Neubiberg (DE); Jacob Tillmann Ludwig, Villach (AT); Iris Moder, Villach (AT); Thomas Christian Neidhart, Klagenfurt (AT); Gerhard Schmidt, Wernberg-Wudmath (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/406,773

(22) Filed: May 8, 2019

(65) Prior Publication Data

US 2019/0348506 A1 Nov. 14, 2019

(30) Foreign Application Priority Data

May 9, 2018 (DE) .............. 102018111213

(51) Int. Cl.
*H01L 29/36* (2006.01)
*H01L 21/223* (2006.01)
(Continued)

(52) U.S. Cl.
CPC ........ *H01L 29/36* (2013.01); *H01L 21/02236* (2013.01); *H01L 21/02381* (2013.01);
(Continued)

(58) Field of Classification Search
CPC ... H01L 29/36; H01L 21/2253; H01L 29/167; H01L 21/2236; H01L 21/26513; H01J 37/32412
See application file for complete search history.

(56) References Cited

U.S. PATENT DOCUMENTS

| 4,629,520 A | 12/1986 | Ueno et al. |
| 2006/0131649 A1* | 6/2006 | Krautbauer ............. H01L 29/36 257/347 |

(Continued)

FOREIGN PATENT DOCUMENTS

DE 102005014157 A1 10/2005

*Primary Examiner* — Alia Sabur
(74) *Attorney, Agent, or Firm* — Murphy, Bilak & Homiller, PLLC

(57) ABSTRACT

A method of manufacturing a semiconductor device includes providing a semiconductor substrate having opposing first and second main surfaces and first and second dopants. A covalent atomic radius of a material of the substrate is i) larger than a covalent atomic radius of the first dopant and smaller than that of the second dopant, or ii) smaller than the covalent atomic radius of the first dopant and larger than that of the second dopant. A vertical extension of the first dopant into the substrate from the first main surface ends at a bottom of a substrate portion at a first vertical distance to the first main surface. The method further includes forming a semiconductor layer on the first main surface, forming semiconductor device elements in the semiconductor layer, and reducing a thickness of the substrate by removing material from the second main surface at least up to the substrate portion.

17 Claims, 5 Drawing Sheets

(51) Int. Cl.
  *H01L 21/02*    (2006.01)
  *H01L 21/225*   (2006.01)
  *H01L 29/167*   (2006.01)
  *H01L 21/265*   (2006.01)

(52) U.S. Cl.
  CPC ...... *H01L 21/2236* (2013.01); *H01L 21/2253* (2013.01); *H01L 21/26513* (2013.01); *H01L 29/167* (2013.01)

(56) References Cited

U.S. PATENT DOCUMENTS

| | | |
|---|---|---|
| 2007/0148890 A1 | 6/2007 | Enicks et al. |
| 2010/0261319 A1* | 10/2010 | Kim ................... H01L 29/165 438/142 |
| 2016/0197164 A1 | 7/2016 | Schulze et al. |
| 2018/0138319 A1* | 5/2018 | Salih .................. H01L 27/0814 |

* cited by examiner

SEMICONDUCTOR DEVICE AND MANUFACTURING METHOD

TECHNICAL FIELD

The present disclosure relates to a semiconductor device and to a method of manufacturing a semiconductor device comprising a doped semiconductor substrate.

BACKGROUND

In semiconductor device manufacturing semiconductor substrates, for example semiconductor wafers are used as a starting point of the manufacturing process. Depending on a size of the semiconductor substrate and on a size of the chip, a plurality of semiconductor chips may be formed from one semiconductor substrate by wafer dicing, for example. Alternatively, a single semiconductor chip may be formed from a single semiconductor substrate, for example a semiconductor power thyristor or a semiconductor power diode. Since the characteristics of the semiconductor substrate may have an impact on the reliability of the manufacturing process as well as on the device parameters of the semiconductor chips formed in the semiconductor substrate, it is desirable to improve the characteristics of semiconductor substrates for device manufacturing and to provide semiconductor devices based on improved semiconductor substrates.

SUMMARY

The present disclosure relates to a method of manufacturing a semiconductor device. The method comprises providing a semiconductor substrate having a first main surface and a second main surface opposite to the first main surface, wherein the semiconductor substrate comprises a first dopant and a second dopant, and a covalent atomic radius of a material of the semiconductor substrate is i) larger than a covalent atomic radius of the first dopant and smaller than a covalent atomic radius of the second dopant, or ii) smaller than a covalent atomic radius of the first dopant and larger than a covalent atomic radius of the second dopant. A vertical extension of the first dopant into the semiconductor substrate from the first main surface ends at a bottom of a first semiconductor substrate portion at a first vertical distance to the first main surface. Thereafter, the method further comprises forming a semiconductor layer on the first main surface and forming semiconductor device elements in the semiconductor layer. The method further comprises reducing a thickness of the semiconductor substrate by removing a material of the semiconductor substrate from the second main surface at least up to the first semiconductor substrate portion.

The present disclosure further relates to a semiconductor device comprising a semiconductor substrate. The semiconductor substrate comprises a first dopant and a second dopant, wherein a covalent atomic radius of a material of the semiconductor substrate is i) larger than a covalent atomic radius of the first dopant and smaller than a covalent atomic radius of the second dopant, or ii) smaller than a covalent atomic radius of the first dopant and larger than a covalent atomic radius of the second dopant. The semiconductor device further comprises a semiconductor layer on the semiconductor substrate and semiconductor device elements in the semiconductor layer. A vertical concentration profile $N1(y)$ of the first dopant decreases along at least 80% of a distance between an interface of the semiconductor substrate and the semiconductor layer to a surface of the semiconductor substrate opposite to the interface.

BRIEF DESCRIPTION OF THE DRAWINGS

The accompanying drawings are included to provide a further understanding of the embodiments and are incorporated in and constitute a part of this specification. The drawings illustrate the embodiments and together with the description serve to explain principles of the embodiments. Further embodiments are described in the following detailed description and the claims.

DETAILED DESCRIPTION

In the following detailed description, reference is made to the accompanying drawings, which form a part hereof and in which are shown by way of illustrations specific embodiments in which a SiC device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

Ranges given for a parameter include the boundary values. For example, a range for a parameter y from a to b reads as a≤y≤b. A parameter y with a value of at least c reads as c≤y and a parameter y with a value of at most d reads as y≤d.

IGFETs (insulated gate field effect transistor) are voltage controlled devices including MOSFETs (metal oxide semiconductor FETs) and other FETs with gate electrodes based on doped semiconductor material and/or with gate dielectrics that are not exclusively based on an oxide.

FIGS. 1A to 1D are schematic cross-sectional views of a semiconductor substrate 102 for illustrating an embodiment of manufacturing a semiconductor device.

Figure 1A:
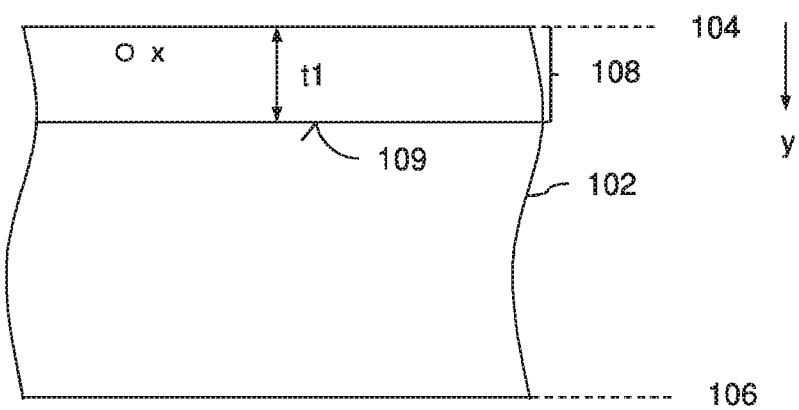
FIGS. 1A to 1D are schematic cross-sectional views of a semiconductor substrate for illustrating an embodiment of a method of manufacturing a semiconductor device.

Referring to the schematic cross-sectional view of FIG. 1A, a semiconductor substrate 102 is provided, the semiconductor substrate 102 having a first main surface 104 and a second main surface 106 opposite to the first main surface 104 along a vertical direction y. The semiconductor substrate 102 comprises a first dopant and a second dopant. Fur illustration purposes, the first dopant is exemplified in FIG. 1A by symbol "o". Likewise, the second dopant is exemplified in FIG. 1A by symbol "x". Herein, the term dopant refers to a dopant species, for example an element such as phosphorus being an n-type dopant in silicon or arsenic being another n-type dopant in silicon. The first dopant and the second dopant are different. The semiconductor substrate 102 may be a semiconductor wafer from a crystalline material such as silicon (Si), germanium (Ge), silicon germanium (Site), silicon carbide (SiC) or an $A_{III}B_V$ semiconductor. The semiconductor substrate 102 may have a diameter of 200 mm, 300 mm or 450 mm, for example.

A covalent atomic radius of a material of the semiconductor substrate 102 is i) larger than a covalent atomic radius of the first dopant and smaller than a covalent atomic radius of the second dopant, or ii) smaller than a covalent atomic radius of the first dopant and larger than a covalent atomic radius of the second dopant. Exemplifying case i), when using silicon (Si) as the material of the semiconductor substrate 102, the first dopant may be phosphorus (P). Silicon has a covalent atomic radius of 111 pm that is larger than the covalent atomic radius of phosphorus which is 107 pm. The second dopant may be arsenic having a covalent atomic radius of 119 pm. The covalent atomic radius of silicon is smaller than the covalent atomic radius of arsenic. Exemplifying case ii), when using silicon (Si) as the material of the semiconductor substrate 102, the first dopant may be arsenic and the second dopant may be phosphorus. According to the example illustrated in FIG. 1A, a vertical extension of the first dopant into the semiconductor substrate 102 from the first main surface 104 ends at a bottom 109 of a first semiconductor substrate portion 108 at a first vertical distance t1 to the first main surface 104. The first dopant is absent or at least less than $10^{14}$ doping atoms per $cm^3$ in a second substrate portion that directly adjoins the first semiconductor substrate portion 108 at the bottom side 109. The second substrate portion may extend up to the second main surface 106 or may be arranged between the first semiconductor substrate portion 108 and a third substrate portion. In latter case, the first dopant may be again present in the third substrate portion which, for example, may extend up to the second main surface 106.

Figure 1B:
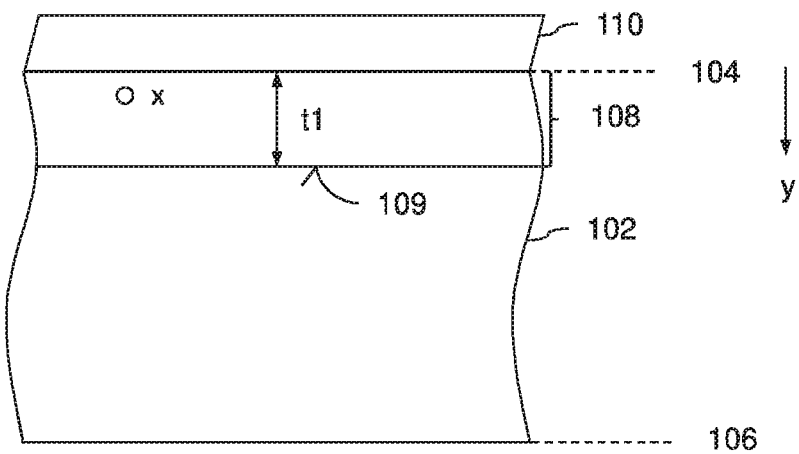

Referring to the schematic cross-sectional view of FIG. 1B, the method further comprises forming a semiconductor layer 110 on the first main surface 104. The semiconductor layer may be formed by a layer formation process, for example CVD (chemical vapor deposition) such as LPCVD (low pressure CVD) or APCVD (atmospheric pressure CVD), VPE (vapor phase epitaxy), LPE (liquid phase epitaxy) or MBE (molecular beam epitaxy). A material of the semiconductor layer 110 may correspond to the material of the semiconductor substrate 102 or may differ from the material of the semiconductor substrate 102. In latter case, this may allow for adjusting electrical characteristics in the semiconductor layer 110, for example by stress-induced mobility enhancement.

Figure 1C:
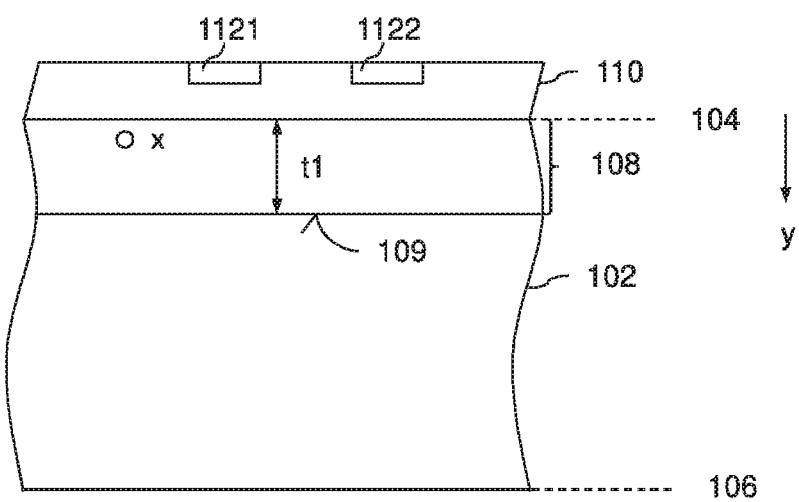

Referring to the schematic cross-sectional view of FIG. 1C, the method further comprises forming semiconductor device elements 1121, 1122 in the semiconductor layer 110. The semiconductor device elements 1121, 1122 may include doped semiconductor regions, for example n-doped and/or p-doped semiconductor regions for functional purposes, for example source or drain regions of insulated gate field effect transistors (IGFETs) such as metal oxide semiconductor FETs (MOSFETs) or insulated gate bipolar transistors (IGBTs), cathode or anode regions of diodes or thyristors/silicon controlled rectifiers, emitter or base or collector regions of bipolar junction transistors (BJTs), junction termination structures such as variation of lateral doping (VLD) or junction termination extension (JTE), junction isolation, resistors, electrodes such as gate or field electrodes, insulating materials, for example oxides and/or nitrides for functional purposes such as gate dielectric, field dielectric, device isolation such as shallow or deep trench isolation (STI, DTI).

Figure 1D:
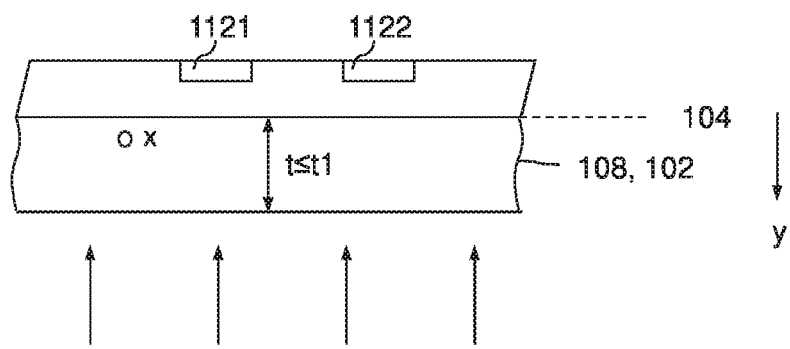

Referring to the schematic cross-sectional view of FIG. 1D, the method further comprises reducing a thickness of the semiconductor substrate 102 by removing a material of the semiconductor substrate 102 from the second main surface 106 at least up to the first semiconductor substrate portion 108. The semiconductor substrate 102 and the semiconductor layer 110 may be mechanically supported by a carrier attached to semiconductor layer 110, for example. Material of the semiconductor substrate 102 may be removed by chemical processes, for example by etching such as dry etching or wet etching, by mechanical processes, for example by abrasive machining such as grinding or polishing, or by chemical-mechanical processes such as chemical-mechanical polishing (CMP). In one or more embodiments, a combination of more than one process for removing material of the semiconductor substrate 102 may be used, for example a first process having a greater material removal rate than a second process following the first process. This may allow for a fine-adjustment of a target wafer thickness, for example. The process for removing material of the semiconductor substrate 102 from the second surface 106 may also include the so-called TAIKO process. The TAIKO process is a wafer thinning process in which an outer support ring along the edge of the wafer is not thinned during the thinning process. The outer support ring may provide improved thin wafer handling during subsequent processing. For example, wafers that are thinned using the TAIKO process can typically maintain their rigidity without being attached to an additional carrier.

The above method allows for improving the characteristics of highly doped, i.e. low-resistive or high-conductive semiconductor substrates for device manufacturing by reducing an overall stress or lattice mismatch in the semiconductor substrate 102. While the first dopant may cause an increase (decrease) of a lattice constant with respect to the semiconductor substrate 102, the second dopant may counteract this increase (decrease). This enables low-resistive semiconductor substrates with respect to a certain wafer bow.

Figure 2:
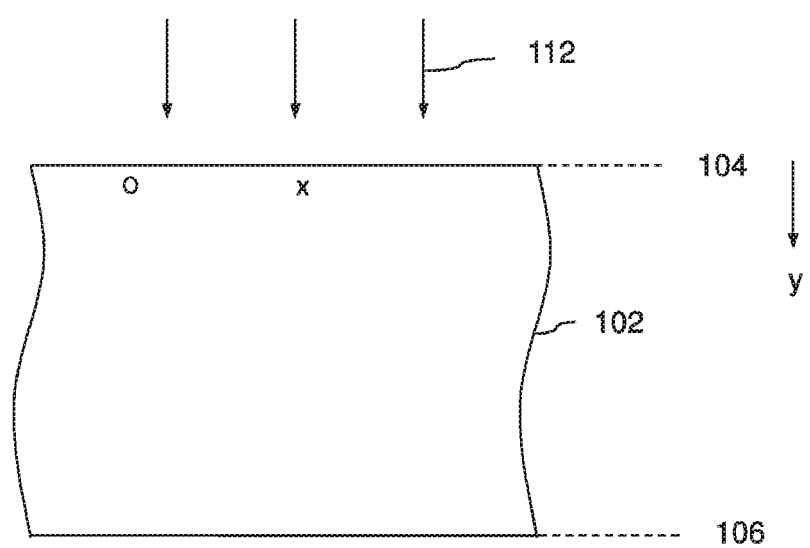
FIG. 2 is a schematic cross-sectional view of a semiconductor substrate for illustrating a process of introducing a first dopant through a first main surface into the semiconductor substrate.

Referring to the schematic cross-sectional view illustrated in FIG. 2, in one or more embodiments, the steps of providing the semiconductor substrate 102 comprise introducing the first dopant through the first main surface 106 into the semiconductor substrate 102 by at least one of a diffusion process, an ion implantation process and a plasma based ion implantation process. Introduction of the first dopant through the first main surface 104 is schematically illustrated by arrows denoted by reference sign 112. Plasma based ion implantation is known by a variety of names and acronyms, including, but not limited to the following: Plasma Source Ion Implantation (PSII), Plasma Immersion Ion Implantation (PIII or PI3), Plasma Ion Implantation (PII or PI2), Plasma Ion Plating (PIP), Plasma Immersion Ion Implantation and Deposition (PIIID), Metal Plasma Immersion Ion Implantation and Deposition (MePIIID), IonClad, Plasma Doping (PLAD), Plasma Ion Immersion Processing (PIIP). Some of these names are synonymous—others emphasize a certain aspect such as the presence of metal ions. The steps of providing the semiconductor substrate 102 further comprise introducing the second dopant through the first main surface 104 into the semiconductor substrate 102 by at least one of a diffusion process, an ion implantation process and a plasma based ion implantation process. The processes of introducing the first dopant and the second dopant may differ from one another, may partly differ from one another or may correspond to one another.

In one or more embodiments, the first vertical distance t1 is in a range from 2 μm to 50 μm, or from 5 μm to 30 μm. The first vertical distance t1 may be set to a desired value by adjusting process parameters such as ion implantation parameters, for example ion implantation energy, implantation dose and a subsequent thermal budget for activating and broadening a dopant profile by diffusion, for example.

In one more embodiments, the first dopant is introduced through the first main surface 104 into the semiconductor substrate 102 by a diffusion process concurrently carried out with an oxidation process of the semiconductor substrate 102. The oxidation process, for example at temperatures ranging from 800° C. to 1200° C. may lead to an oxidation-enhanced diffusion process of the first dopant in the semiconductor substrate 102, for example caused by an impact of the oxidation process on vacancy and interstitial silicon atoms in a semiconductor substrate 102 made of silicon. This may allow for simplifying adjustment of a target profile of the first dopant in the semiconductor substrate 102.

In one or more embodiments, the first dopant is introduced through the first main surface 104 into the semiconductor substrate 102 by a plasma based ion implantation process at a dose in a range from $10^{16}$ cm$^{-2}$ to $10^{18}$ cm$^{-2}$. Plasma based ion implantation processes may enable high concentration values of the first (second) dopant in the semiconductor substrate 102, and hence, a low-resistive semiconductor substrate 102.

Figure 3:
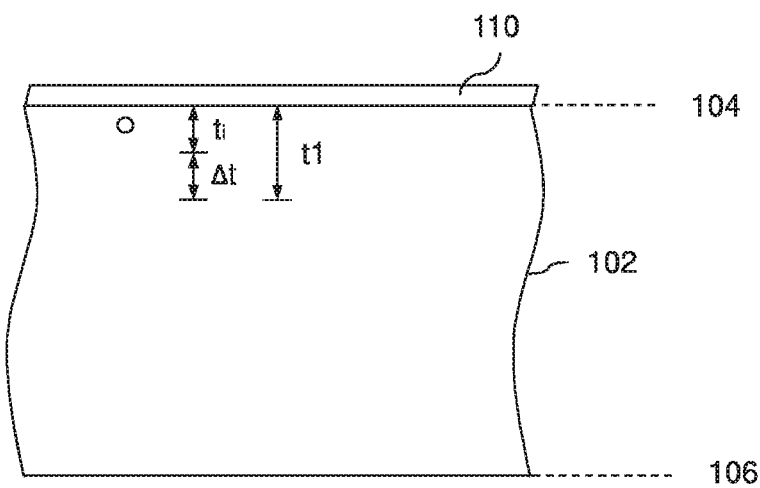
FIG. 3 is a schematic cross-sectional view of a semiconductor substrate for illustrating a process of forming a diffusion barrier on the first main surface of the semiconductor substrate after introduction of the first dopant.

Referring to the schematic cross-sectional view of FIG. 3, according to one or more embodiments, a diffusion barrier 113, for example a CVD oxide is formed on the first main surface 104 of the semiconductor substrate 102 after introduction of the first dopant, and, thereafter a vertical concentration profile of the first dopant is broadened by a thermal diffusion process. Broadening of the vertical concentration profile may increase an initial vertical distance ti between a bottom of the vertical concentration profile and the first main surface 104 by a value Δt up to the first vertical distance t1, for example.

In one or more embodiments, the first dopant and the second dopant are introduced through the first main surface into the semiconductor substrate 102 one after another by an ion implantation process or by a plasma based ion implantation process at different doses and/or energies. Thereby, a dose of the first and second dopants may be precisely set. A vertical concentration profile of the first dopant and a vertical concentration profile of the second dopant may be superimposed by coordinating i) a dose, an energy and a thermal budget for broadening the vertical concentration profile of the first dopant, and ii) a dose, an energy and a thermal budget for broadening the vertical concentration profile of the second dopant. This may enable to improve reduction of wafer bow and stress, for example.

Figure 4:
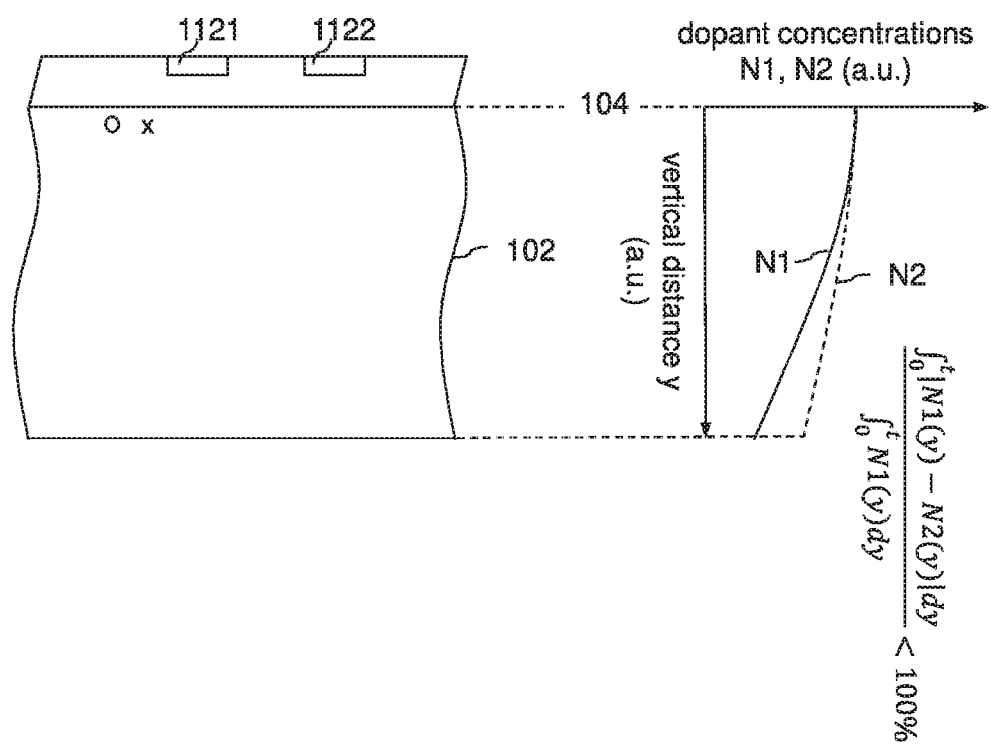
FIG. 4 is a schematic cross-sectional view of a semiconductor substrate for illustrating a coordination of vertical dopant concentration profiles of first and second dopants.

Referring to the schematic graph of FIG. 4, in one or more embodiments, the dose, the energy and the thermal budget for broadening a vertical concentration profile N1(y) of the first dopant and the dose, the energy and the thermal budget for broadening a vertical concentration profile N2(y) of the second dopant are coordinated to satisfy equation (1) below $$\frac{\int_0^t |N1(y) - N2(y)| dy}{\int_0^t N1(y) dy} < 100\%, \quad (1)$$

t being a thickness of the semiconductor substrate 102 after reducing the thickness of the semiconductor substrate 102, i.e. not including a thickness of the semiconductor layer 110. Dose, energy and thermal budget may be even more precisely adjusted to satisfy equation (2) below $$\frac{\int_0^t |N1(y) - N2(y)| dy}{\int_0^t N1(y) dy} < 50\%, \quad (2)$$

or even equation (3) below $$\frac{\int_0^t |N1(y) - N2(y)| dy}{\int_0^t N1(y) dy} < 10\%. \quad (3)$$

By precisely adjusting dose, energy and thermal budget with respect to the first and second dopants, reduction of wafer bow and stress may be further improved, for example.

Figure 5:
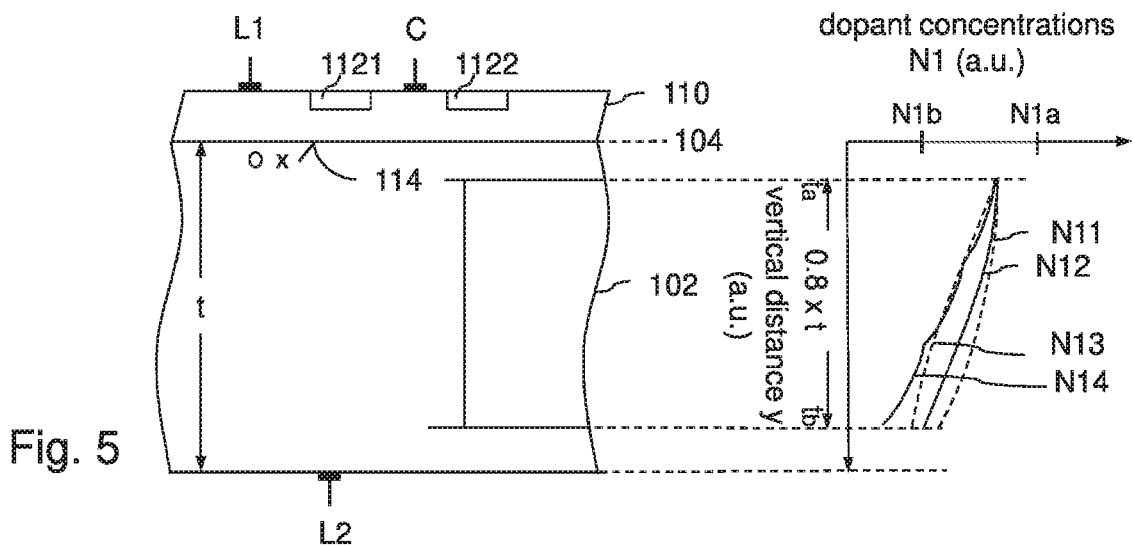
FIG. 5 is a schematic cross-sectional view of a semiconductor substrate for illustrating vertical dopant concentration profiles of the first dopant that decreases between opposite sides of the semiconductor substrate.

Referring to the schematic cross-sectional view of FIG. 5, in one or more embodiments, after reducing the thickness of the semiconductor substrate 102 to a value t, a vertical concentration profile N1(y) of the first dopant decreases along at least 80% of a distance between an interface 114 of the semiconductor substrate 102 and the semiconductor layer 110 to a surface of the semiconductor substrate 102 opposite to the interface 114. The distance corresponds to the thickness t. The vertical concentration profile N1 may steadily decrease as is illustrated by exemplary profiles N11, N12, N13, N14 in the graph of FIG. 5. In one or more embodiments, a concentration Nib of the first dopant at a vertical distance tb to the interface 114 is less than a factor 10 lower, or less than a factor 5 lower, or less than a factor 3 lower than a concentration N1$a$ of the first dopant at a vertical distance ta to the interface 114, the difference between tb and ta, i.e. tb-ta being larger than 80% of the distance t between the interface 114 of the semiconductor substrate 102 and the semiconductor layer 110 to the surface of the semiconductor substrate 102 opposite to the interface 114. In one or more embodiments, a backside doping process from the side opposite to the interface 114 may be carried out, for example by ion implantation or by plasma based ion implantation in combination with an optional melting or non-melting laser annealing step. Thereby, a contact resistance between the semiconductor substrate 102 and a backside metallization layer may be improved, for example.

The method may further comprise forming a first load terminal contact L1 on a surface of the semiconductor layer 110, for example a source contact of an IGFET or IGBT, an emitter contact of a BJT, an anode contact of a diode or a thyristor. The method may further comprise forming a second load terminal contact L2 on a surface of the semiconductor substrate 102 opposite to the interface 114, for example a drain contact of an IGFET, a collector contact of an IGBT or BJT, a cathode contact of a diode or a thyristor. Depending on the specific device type of the semiconductor device, a control terminal contact C may be formed on the surface of the semiconductor layer 110, for example a gate contact of an IGFET or IGBT or thyristor, or a base contact of a BJT.

In one or more embodiments, an average concentration of the vertical concentration profile N1($y$) of the first dopant between the interface 114 of the semiconductor substrate 102 and the semiconductor layer 110 and a surface of the semiconductor substrate opposite to the interface is in a range from $5 \times 10^{18}$ cm$^{-3}$ to $5 \times 10^{20}$ cm$^{-3}$.

In one or more embodiments, the second dopant constitutes a background doping of the semiconductor substrate in a range from $10^{18}$ cm$^{-3}$ to $10^{21}$ cm$^{-3}$. In one or more embodiments, the second dopant is arsenic and the first dopant is phosphorus.

In one or more embodiments, the first dopant is one element out of arsenic, phosphorus, and antimony, and the second dopant is another element out of arsenic, phosphorus and antimony provided that a covalent atomic radius of a material of the semiconductor substrate is i) larger than a covalent atomic radius of the first dopant and smaller than a covalent atomic radius of the second dopant, or ii) smaller than a covalent atomic radius of the first dopant and larger than a covalent atomic radius of the second dopant. In one or more other embodiments, the first dopant is one element out of boron, aluminum, and gallium, and the second dopant is another element out of boron, aluminum, and gallium provided that a covalent atomic radius of a material of the semiconductor substrate is i) larger than a covalent atomic radius of the first dopant and smaller than a covalent atomic radius of the second dopant, or ii) smaller than a covalent atomic radius of the first dopant and larger than a covalent atomic radius of the second dopant.

Figure 6A:
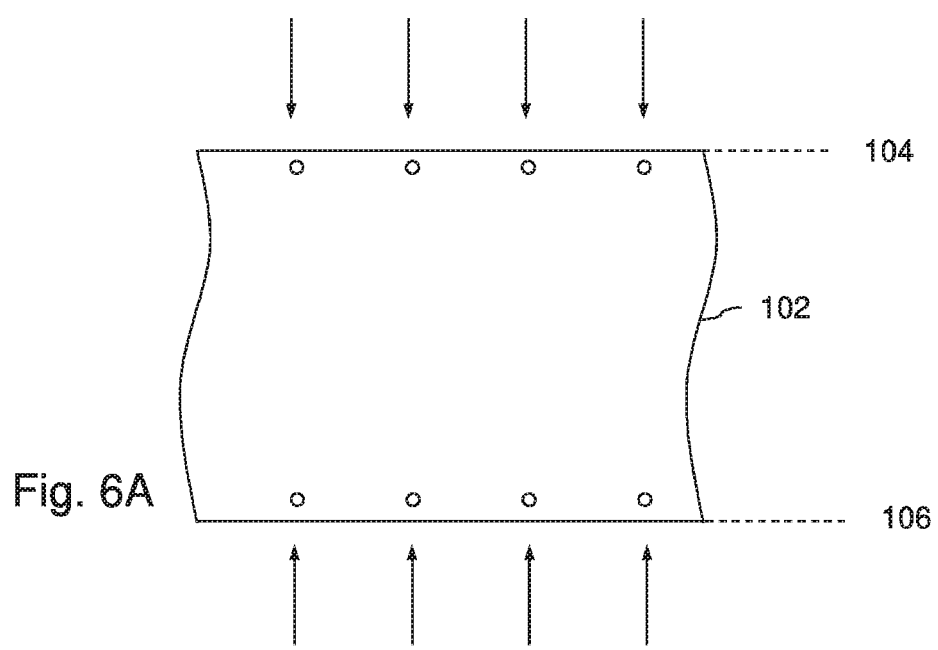
FIGS. 6A and 6B are schematic cross-sectional views of a semiconductor substrate for illustrating processes of introducing the first dopant through opposite surfaces of the semiconductor substrate into the semiconductor substrate followed by formation of a sealing layer on one of the opposite surfaces.

Referring to the schematic cross-sectional view of FIG. 6A, in one or more embodiments, providing the semiconductor substrate 102 further comprises introducing the first dopant through the first main surface 104 and through the second main surface 106 into the semiconductor substrate 102 by at least one of a diffusion process, an ion implantation process and a plasma based ion implantation process. Furnace doping may allow for simultaneously introducing the first dopant through the first main surface 104 and through the second main surface 106 into the semiconductor substrate, for example.

Figure 6B:
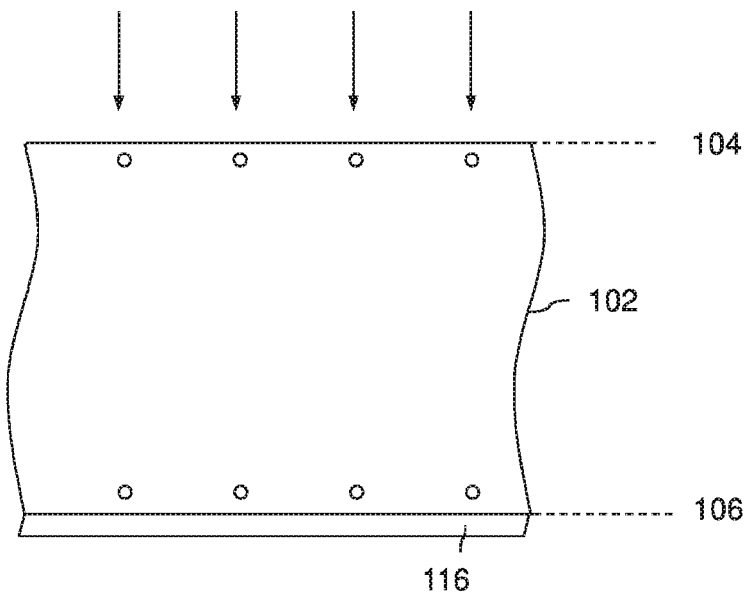

Referring to the schematic cross-sectional view of FIG. 6B, before reducing the thickness of the semiconductor substrate, a sealing layer 116 is formed on the second main surface 106 of the semiconductor substrate 102. Formation of the sealing layer 116 may enable to prevent auto-doping during subsequent processing of the semiconductor substrate 102, for example during the processes illustrated with respect to FIGS. 1B to 1C.

Figure 7A:
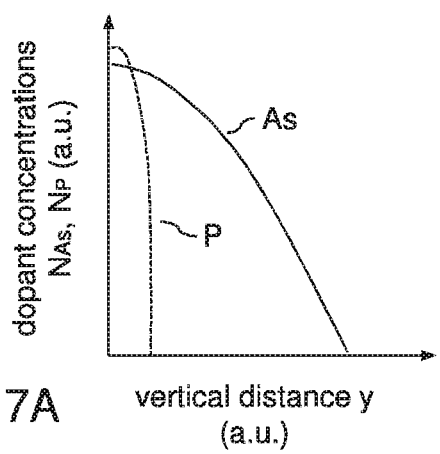
FIGS. 7A and 7B are schematic cross-sectional views of a semiconductor substrate for illustrating processes of introducing arsenic and phosphorus into the semiconductor substrate in conjunction with different thermal drive-in budgets for coordinating an optimum overlap of concentration profiles of arsenic and phosphorus.
Figure 7B:
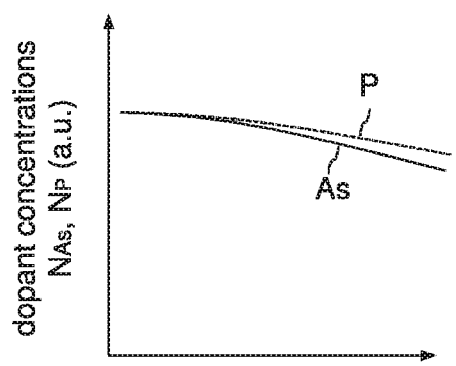

Referring to the schematic graphs of FIGS. 7A and 7B, arsenic is introduced into the semiconductor substrate 102 as the first dopant and phosphorus is introduced into the semiconductor substrate 102 as the second dopant. Due to the different diffusion coefficients of arsenic and phosphorus, different thermal budgets may be used to adjust dopant concentration profiles $N_{As}$, $N_P$ of arsenic and phosphorus. In one or more embodiments, a first ion implantation or plasma based ion implantation process of arsenic and a first drive-in process of the implanted arsenic may be followed by a second ion implantation or plasma based ion implantation process of phosphorus and a second drive in-process of both the implanted arsenic and the implanted phosphorus. Thereby, different thermal budgets may be applied to arsenic and phosphorus to coordinate an optimum overlap of the dopant concentration profiles $N_{As}$, $N_P$ of arsenic and phosphorus as is illustrated in FIG. 7B resulting from TCAD (technology computer-aided design) simulation.

In one or more embodiments, a thickness of the semiconductor substrate is reduced to a value in a range from 2 μm to 50 μm, or from 5 μm to 30 μm.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method of manufacturing a semiconductor device, the method comprising:

providing a semiconductor substrate having a first main surface and a second main surface opposite to the first main surface, wherein the semiconductor substrate comprises a first dopant and a second dopant, and a covalent atomic radius of a material of the semiconductor substrate is i) larger than a covalent atomic radius of the first dopant and smaller than a covalent atomic radius of the second dopant, or ii) smaller than the covalent atomic radius of the first dopant and larger than the covalent atomic radius of the second dopant, and wherein a vertical extension of the first dopant into the semiconductor substrate from the first main surface ends at a bottom of a first semiconductor substrate portion at a first vertical distance to the first main surface;

forming a semiconductor layer on the first main surface;

forming semiconductor device elements in the semiconductor layer; and reducing a thickness of the semiconductor substrate by removing a material of the semiconductor substrate from the second main surface at least up to the first semiconductor substrate portion, wherein the first dopant is introduced through the first main surface into the semiconductor substrate by a plasma based ion implantation process at a dose in a range from $10^{16}$ cm$^{-2}$ to $10^{18}$ cm$^{-2}$.

2. The method of claim 1, wherein providing the semiconductor substrate comprises:

introducing the second dopant through the first main surface into the semiconductor substrate by at least one of a diffusion process, an ion implantation process and a plasma based ion implantation process.

3. The method of claim 1, further comprising:

forming a diffusion barrier on the first main surface of the semiconductor substrate after introduction of the first dopant; and subsequently performing a thermal diffusion process to broaden a vertical concentration profile of the first dopant.

4. The method of claim 1, wherein the first dopant and the second dopant are introduced through the first main surface into the semiconductor substrate one after the other at different doses and/or energies.

5. The method of claim 4, wherein a vertical concentration profile of the first dopant and a vertical concentration profile of the second dopant are superimposed by coordinating i) a dose, an energy and a thermal budget for broadening a vertical concentration profile of the first dopant, and ii) a dose, an energy and a thermal budget for broadening a vertical concentration profile of the second dopant.

6. The method of claim 5, wherein the dose, the energy and the thermal budget for broadening a vertical concentration profile $N1(y)$ of the first dopant and the dose, the energy and the thermal budget for broadening a vertical concentration profile $N2(y)$ of the second dopant are coordinated to satisfy:

$$\frac{\int_0^t |N1(y) - N2(y)| dy}{\int_0^t N1(y) dy} < 100\%,$$

where t is a thickness of the semiconductor substrate after reducing the thickness of the semiconductor substrate.

7. The method of claim 1, wherein, after reducing the thickness of the semiconductor substrate, a vertical concentration profile of the first dopant decreases along at least 80% of a distance between an interface of the semiconductor substrate and the semiconductor layer to a surface of the semiconductor substrate opposite to the interface.

8. The method of claim 1, wherein an average concentration of a vertical concentration profile of the first dopant between an interface of the semiconductor substrate and the semiconductor layer to a surface of the semiconductor substrate opposite to the interface is in a range from $5 \times 10^{18}$ cm$^{-3}$ to $5 \times 10^{20}$ cm$^{-3}$.

9. The method of claim 1, wherein the second dopant constitutes a background doping of the semiconductor substrate in a range from $10^{18}$ cm$^{-3}$ to $10^{21}$ cm$^{-3}$.

10. The method of claim 1, wherein the first dopant is one element selected from the group consisting of arsenic, phosphorus, and antimony, and wherein the second dopant is a different element selected from the group consisting of arsenic, phosphorus and antimony.

11. The method of claim 1, wherein the first dopant is one element selected from the group consisting of boron, aluminum, and gallium, and the wherein second dopant is a different element selected from the group consisting of boron, aluminum, and gallium.

12. The method of claim 1, wherein providing the semiconductor substrate comprises:

after introducing the first dopant but before reducing the thickness of the semiconductor substrate, forming a sealing layer on the second main surface of the semiconductor substrate.

13. A method of manufacturing a semiconductor device, the method comprising:

providing a semiconductor substrate having a first main surface and a second main surface opposite to the first main surface, wherein the semiconductor substrate comprises a first dopant and a second dopant, and a covalent atomic radius of a material of the semiconductor substrate is i) larger than a covalent atomic radius of the first dopant and smaller than a covalent atomic radius of the second dopant, or ii) smaller than the covalent atomic radius of the first dopant and larger than the covalent atomic radius of the second dopant, and wherein a vertical extension of the first dopant into the semiconductor substrate from the first main surface ends at a bottom of a first semiconductor substrate portion at a first vertical distance to the first main surface;

forming a semiconductor layer on the first main surface;

forming semiconductor device elements in the semiconductor layer; and reducing a thickness of the semiconductor substrate by removing a material of the semiconductor substrate from the second main surface at least up to the first semiconductor substrate portion, wherein providing the semiconductor substrate comprises:

introducing the first dopant through the first main surface and through the second main surface into the semiconductor substrate by at least one of a diffusion process, an ion implantation process and a plasma based ion implantation process; and after introducing the first dopant but before reducing the thickness of the semiconductor substrate, forming a sealing layer on the second main surface of the semiconductor substrate.

14. The method of claim 13, wherein, after reducing the thickness of the semiconductor substrate, a vertical concentration profile of the first dopant decreases along at least 80% of a distance between an interface of the semiconductor substrate and the semiconductor layer to a surface of the semiconductor substrate opposite to the interface.

15. The method of claim 13, wherein an average concentration of a vertical concentration profile of the first dopant between an interface of the semiconductor substrate and the semiconductor layer to a surface of the semiconductor substrate opposite to the interface is in a range from $5 \times 10^{18}$ cm$^{-3}$ to $5 \times 10^{20}$ cm$^{-3}$.

16. The method of claim 13, wherein the second dopant constitutes a background doping of the semiconductor substrate in a range from $10^{18}$ cm$^{-3}$ to $10^{21}$ cm$^{-3}$.

17. The method of claim 13, wherein the first dopant is one element selected from the group consisting of arsenic, phosphorus, and antimony, and wherein the second dopant is a different element selected from the group consisting of arsenic, phosphorus and antimony.

* * * * *